(12) United States Patent
Riedijk

(10) Patent No.: US 9,460,576 B2
(45) Date of Patent: Oct. 4, 2016

(54) CAPACITIVE FINGERPRINT SENSING DEVICE WITH DEMODULATION CIRCUITRY IN SENSING ELEMENT

(71) Applicant: FINGERPRINT CARDS AB, Göteborg (SE)

(72) Inventor: Frank Robert Riedijk, Delft (NL)

(73) Assignee: FINGERPRINT CARDS AB, Göteborg (SE)

( * ) Notice: Subject to any disclaimer, the term of this patent is extended or adjusted under 35 U.S.C. 154(b) by 0 days.

(21) Appl. No.: 14/812,480

(22) Filed: Jul. 29, 2015

(65) Prior Publication Data
US 2016/0180619 A1    Jun. 23, 2016

(51) Int. Cl.
*G01R 27/26* (2006.01)
*G07C 9/00* (2006.01)

(52) U.S. Cl.
CPC ....... *G07C 9/00158* (2013.01); *G01R 27/2605* (2013.01)

(58) Field of Classification Search
CPC .............. G06F 3/044; G06F 3/0416; G06F 2203/04104; G06F 2203/04112; G06F 3/041; G06F 2203/04107; G06F 2203/04106; G06F 2203/04105; G06F 2203/04808; G06F 2203/04101; G06F 2203/04108; G06F 3/03547; G06F 3/0488; G06K 7/10178; G06K 9/00832; G06K 19/0717; G06K 9/00838; G06K 9/2018; G06K 9/6269; G06K 9/66; G01R 27/2605; G01R 35/005; G01R 33/0283; G01L 17/00; G01L 1/205
See application file for complete search history.

(56) References Cited

U.S. PATENT DOCUMENTS

| | | | | |
|---|---|---|---|---|
| 5,565,658 | A * | 10/1996 | Gerpheide | G06F 3/041 178/18.02 |
| 7,864,992 | B2 | 1/2011 | Riedijk et al. | |
| 9,152,841 | B1 * | 10/2015 | Riedijk | G06K 9/0002 |
| 2011/0210939 | A1 * | 9/2011 | Reynolds | G06F 3/0418 345/174 |
| 2012/0268416 | A1 * | 10/2012 | Pirogov | G06F 3/044 345/174 |

* cited by examiner

*Primary Examiner* — Vinh Nguyen
(74) *Attorney, Agent, or Firm* — Remarck Law Group PLC

(57) ABSTRACT

A capacitive fingerprint sensing system includes excitation signal providing circuitry and a plurality of sensing elements. Each sensing element includes a protective dielectric top layer, an electrically conductive sensing structure coupled to the excitation signal for providing a sensing signal indicative of a change of a charge carried by the sensing structure resulting from a change in potential difference between the finger and the sensing structure, and demodulation circuitry connected to the sensing circuitry for combining the sensing signal and a demodulation signal being timing-related to the excitation signal to provide a combined signal including a DC signal component indicating the change of the charge carried by the sensing structure. The fingerprint sensing system further includes readout circuitry connected to each of the sensing elements for providing a representation of the fingerprint pattern based on the DC signal component from each of the sensing elements.

15 Claims, 11 Drawing Sheets

CAPACITIVE FINGERPRINT SENSING DEVICE WITH DEMODULATION CIRCUITRY IN SENSING ELEMENT

CROSS-REFERENCE TO RELATED APPLICATIONS

This application claims the benefit of Swedish Patent Application No. 1451634-8, filed Dec. 22, 2014. The disclosure of the above application is incorporated herein by reference in its entirety.

FIELD OF THE INVENTION

The present invention relates to a capacitive fingerprint sensing system and to a method of sensing a fingerprint pattern.

BACKGROUND OF THE INVENTION

Various types of biometric systems are used more and more in order to provide for increased security and/or enhanced user convenience.

In particular, fingerprint sensing systems have been adopted in, for example, consumer electronic devices, thanks to their small form factor, high performance, and user acceptance.

Among the various available fingerprint sensing principles (such as capacitive, optical, thermal etc), capacitive sensing is most commonly used, in particular in applications where size and power consumption are important issues.

All capacitive fingerprint sensors provide a measure indicative of the capacitance between each of several sensing structures and a finger placed on or moved across the surface of the fingerprint sensor.

Some capacitive fingerprint sensors passively read out the capacitance between the sensing structures and the finger. This, however, requires a relatively large capacitance between sensing structure and finger. Therefore such passive capacitive sensors are typically provided with a very thin protective layer covering the sensing structures, which makes such sensors rather sensitive to scratching and/or ESD (electro-static discharge).

U.S. Pat. No. 7,864,992 discloses a capacitive fingerprint sensing system in which a driving signal is injected into the finger by pulsing a conductive structure arranged in the vicinity of the sensor array and measuring the resulting change of the charge carried by the sensing structures in the sensor array.

Such active capacitive fingerprint sensing systems generally enable measurement of the capacitance between the finger and each of the sensing structures with a much higher signal-to-noise ratio than the above-mentioned passive systems. This, in turn, allows for a considerably thicker protective coating and thus for more robust capacitive fingerprint sensors that can be included in items subjected to considerable wear, such as mobile phones.

However, there is still room for improvement. In particular, it would be desirable to provide for fingerprint sensing through even thicker protective coatings and/or for further improved performance in respect of signal-to-noise ratio.

SUMMARY

In view of the above-mentioned and other drawbacks of the prior art, it is an object of the present invention to achieve an improved capacitive fingerprint sensing system, in particular a capacitive fingerprint sensing system providing for improved sensing performance through very thick protective coatings.

According to a first aspect of the present invention, it is therefore provided a capacitive fingerprint sensing system for sensing a fingerprint pattern of a finger, the capacitive fingerprint sensing system comprising: excitation signal providing circuitry for providing an excitation signal exhibiting a time-varying excitation potential including recurring changes from a first potential to a second potential and back to the first potential, in relation to a potential of the finger; a plurality of sensing elements, each including: a protective dielectric top layer to be touched by the finger; an electrically conductive sensing structure arranged underneath the top layer, the sensing structure being coupled to the excitation signal providing circuitry to exhibit a time-varying sensing structure potential substantially following the excitation potential, wherein each of the changes of the excitation potential from the first potential to the second potential results in a change in potential difference between the finger and the sensing structure; sensing circuitry connected to the sensing structure for providing a sensing signal indicative of a change of a charge carried by the sensing structure resulting from the change in potential difference between the finger and the sensing structure; and demodulation circuitry connected to the sensing circuitry for combining the sensing signal and a demodulation signal being timing-related to the excitation signal to provide a combined signal including a DC signal component indicating the change of the charge carried by the sensing structure; and readout circuitry connected to each of the sensing elements for providing a representation of the fingerprint pattern based on the DC signal component from each of the sensing elements.

In the context of the present application, the term "potential" should be understood to mean "electrical potential".

A time-varying potential should, accordingly, be understood to mean an electrical potential with a magnitude that varies over time in relation to a reference potential. The time-varying excitation potential may, for instance, be provided as a pulse train having a pulse repetition frequency or a combination of pulse repetition frequencies. The pulses in such a pulse train may, for example, be square wave pulses. Alternatively, the time-varying excitation potential may be provided as a sine wave or a combination of sine waves.

The sensing elements may advantageously be arranged in an array comprising rows and columns.

Each sensing structure may advantageously be provided in the form of a metal plate, so that a kind of parallel plate capacitor is formed by the sensing structure (the sensing plate), the local finger surface, and the protective coating (and any air that may locally exist between the local finger surface and the protective coating depending on location in the fingerprint pattern). The change of the charge carried by the sensing structure resulting from the change in potential difference between the finger and the sensing structure is an indication of the capacitance of this parallel plate capacitor, which is in turn an indication of the distance between the sensing structure and the finger surface.

The protective coating may advantageously be at least 20 µm thick and have a high dielectric strength to protect the underlying structures of the fingerprint sensing device from wear and tear as well as from ESD. Even more advantageously, the protective coating may be at least 50 µm thick. In embodiments, the protective coating may be a few hundred µm thick.

Each sensing element may be controllable to perform a predetermined measurement sequence involving transitioning between different measurement states in a predetermined sequence. A measurement state may be defined by a certain combination of control signals provided to the circuitry comprised in the sensing element.

The excitation signal providing circuitry may comprise switching circuitry configured to switch between two or more different potentials provided on different lines. Alternatively or in combination, the excitation signal providing circuitry may comprise at least one signal source configured to provide the time-varying excitation potential.

The excitation signal providing circuitry may be included in a fingerprint sensor component, and may then provide the excitation signal having the time-varying excitation potential in relation to a reference potential of the fingerprint sensor component, for example a sensor ground potential.

Alternatively, the excitation signal providing circuitry may be provided externally to the fingerprint sensor component and be connected to the fingerprint sensor component to provide the excitation signal as a time-varying reference potential for the fingerprint sensor component. In this case, the excitation signal may exhibit its time-varying excitation potential in relation to a device ground potential of the electronic device in which the fingerprint sensing system is included. External excitation signal providing circuitry may be controlled using control signals generated by timing circuitry comprised in the fingerprint sensor component.

The time-varying sensing structure potential substantially follows the excitation potential when a change in the excitation potential results in a corresponding change in the sensing structure potential. The change in the sensing structure potential need not be exactly simultaneous with the change in the excitation potential, but there may be some delay depending on the properties of the coupling between the excitation signal providing circuitry and the sensing structure. Furthermore, there may be a potential shift between the excitation potential and the sensing structure potential, and there may be some scaling. However, the overall behavior of the excitation potential should reflect on the sensing structure potential.

That the demodulation signal is timing-related to the excitation signal should be understood to mean that the timing of the above-mentioned changes from the first potential to the second potential and/or from the second potential to the first potential of the excitation signal will determine the timing of changes in potential of the demodulation signal.

In some embodiments, the demodulation signal may be short pulses defining sampling events, and in other embodiments, the excitation signal itself may constitute the demodulation signal.

The present invention is based upon the realization that faster operation of the sensing elements would allow multiple readouts from each sensing element during one sensing event resulting in a measure indicating the local distance between that sensing element and the finger surface. This would in turn provide for improved sensing performance, for example in terms of signal-to-noise ratio and common mode noise reduction.

The present inventor has further realized that the desired faster operation of the sensing elements can be achieved without a corresponding increase in power consumption by at least partly demodulating the sensing signal locally in the sensing element in such a way that the desired information content of the sensing signal—the above-mentioned change in charge carried by the sensing structure—is indicated by a DC signal or a near DC signal (constant voltage in relation to a reference potential of the fingerprint sensing system).

By outputting from each sensing element the change of the charge carried by the sensing structure as a DC signal component, it will not be necessary to move the readout line up and down in potential against the parasitic capacitance of the readout line, which provides for a considerably reduced energy consumption per readout event.

Accordingly, embodiments of the present invention provide for a higher readout frequency without a corresponding increase in energy consumption, which in turn allows improved sensing performance and further enables combination of multiple output signals through per se known filtering techniques, whereby the common mode noise can be reduced and the signal-to-noise ratio increased.

This allows for measurement through thicker dielectric coatings, such as a control button or a part of the cover of an electronic device, such as a mobile phone. Furthermore, it may be possible to reduce the energy consumption of the fingerprint sensor and/or reduce the time needed to obtain a fingerprint representation (image).

In embodiments, the readout circuitry may be configured to provide a temporal average or sum of several readings of a particular sensing element or group of sensing elements. In other embodiments, the readout circuitry may be configured to receive—consecutively or substantially simultaneously—the above-mentioned combined signal from a plurality of sensing elements. Hereby, a spatial average can be formed, which may be useful for, for example, noise cancellation and/or gain control.

In various embodiments of the fingerprint sensing system according to the present invention, the sensing circuitry may advantageously include a charge amplifier comprising a first input connected to the sensing structure; a second input connected to the excitation signal providing circuitry; an output providing the sensing signal; a feedback capacitor connected between the first input and the output; and at least one amplifier stage between the first and second inputs, and the output, the charge amplifier being configured in such a way that a potential at the first input substantially follows a potential at the second input.

The charge amplifier converts charge at the first input to a voltage at the output. The gain of the charge amplifier is determined by the capacitance of the feedback capacitor.

That the charge amplifier is configured in such a way that the potential at the first input (sometimes also referred to as the negative input) substantially follows the potential at the second input (sometimes also referred to as the positive input) should be understood to mean that a change in the potential at the second input results in a substantially corresponding change in the potential at the first input. Depending on the actual configuration of the charge amplifier, the potential at the first input may be substantially the same as the potential at the second input, or there may be a substantially constant potential difference between the second input and the first input. If, for instance, the charge amplifier is configured as a single stage amplifier, the potential difference will be the gate-source voltage of the sense transistor.

It should be noted that the output of the charge amplifier need not be directly connected to the feedback capacitor, and that there may be additional circuitry between the output and the feedback capacitor. This circuitry could also be placed outside the array of sensing elements.

According to embodiments, the demodulation circuitry may comprise signal multiplication circuitry for multiplying the sensing signal with the demodulation signal.

By multiplying the sensing signal and the demodulation signal, the change of the charge carried by the sensing structure can be mathematically separated as the desired DC signal component, allowing for facilitated signal transport and processing in the fingerprint sensing system.

The signal multiplying circuitry may be any circuitry capable of multiplying the instantaneous voltage of the two signals (the sensing signal and the demodulation signal) together to produce its output signal from instant to instant.

Examples of signal multiplying circuitry include different types of mixers, such as multiplier mixers or switching mixers.

A sampler for correlated double sampling may also be mathematically considered as signal multiplying circuitry, in which a demodulation signal with a negative pulse and a positive pulse is multiplied with the sensing signal.

The demodulation circuitry may further comprise a low-pass filter for allowing the DC signal component to pass while removing higher frequency components. Alternatively or in combination, a low-pass filter may be provided outside the sensing element for low-pass filtering the combined signal output by the sensing element. The low-pass filter may be included in the readout circuitry.

In various embodiments, readout lines interconnecting the sensing elements and the readout circuitry may act as low pass filters, due to the parasitic capacitances between neighboring readout lines and between a readout line and other structures in the fingerprint sensor component, such as ground and/or supply voltage rails.

To enable the readout lines and their associated parasitic capacitances to act as suitable low pass filters for the combined signal provided by the sensing elements, each sensing element may be configured to provide a maximum output current of less than 10 µA.

For a typical CMOS design resulting in a parasitic capacitance of the output lines in the order of 1-10 pF, and a readout frequency from each sensing element being in the order of 10-100 MHz, a maximum output current of less than 10 µA will allow the readout line(s) to function as a (part of) a low-pass filter.

Hereby, higher frequency components can be sufficiently attenuated between each sensing element and the readout circuitry, so that substantially only the desired DC signal component remains at the readout circuitry. This provides for a simplified fingerprint sensor design as well as for low energy consumption.

According to various embodiments, the amplifier stage comprised in the charge amplifier may comprise a sense transistor having a gate constituting the first input. The sense transistor may be formed in a well in a semiconductor substrate, an interface between the well and the substrate being configured in such a way that current can be prevented from flowing between the well and the substrate. Furthermore, the excitation signal providing circuitry may be connected to the well for changing a potential of the well from a third potential to a fourth potential, a difference between the third potential and the fourth potential being substantially equal to a difference between the above-mentioned first potential and second potential, to thereby reduce an influence of a parasitic capacitance between the sensing structure and the well.

The semiconductor substrate may advantageously be a doped semiconductor substrate, and the well may be a portion of the substrate doped to opposite polarity with respect to the semiconductor substrate (if the semiconductor substrate is p-doped, the well may be n-doped, and if the semiconductor substrate is n-doped, the well may be p-doped). This is one way of achieving an interface between the well and the substrate that is configured in such a way that a current can be prevented from flowing between the well and the substrate. In particular, the well and the substrate may be kept at such electrical potentials that no current flows through the diode formed at the interface between the substrate and the well.

Alternatively, an insulating layer may be provided between the substrate and the well, for instance in the form of a thin layer of glass. Such an insulating layer will also prevent current from flowing between the well and the substrate.

The present inventor has realized that, in embodiments of the present invention, the influence of the parasitic capacitance between the sensing structure and semiconductor structures in the fingerprint sensing device can be considerably reduced by providing excitation signal providing circuitry configured to change a potential of the well in which the sense transistor of the charge amplifier is formed. Hereby, the potential of the well, which is the semiconductor structure adjacent to the connection between the sensing structure and the sense transistor (input stage of the charge amplifier) can be controlled to follow the potential of the sensing structure so that the potential difference between the well and the sensing structure is kept substantially constant, at least at points in time that are relevant to the measurement of the capacitance between the sensing structure and the finger.

According to various embodiments, moreover, the fingerprint sensing device may further comprise a shielding structure arranged between the sensing structure and the substrate. The excitation signal providing circuitry may further be connected to the shielding structure and configured to change a potential of the shielding structure from a fifth potential to a sixth potential, a difference between the fifth potential and the sixth potential being substantially equal to a difference between the above-mentioned first potential and second potential.

Hereby, the sensing structure may effectively be shielded from other possibly underlying parts of the sensing element, such as connecting lines in metal layers, and/or connecting lines and/or semiconductor circuitry formed in the semiconductor substrate. This will further reduce the influence of parasitic capacitances in the sensing element.

The fifth potential may advantageously be equal to the above-mentioned third (and/or first) potential, and the sixth potential may advantageously be equal to the above-mentioned fourth (and/or second) potential. For example, the shielding structure (plate) may advantageously be directly conductively connected to the well.

According to a first set of embodiments, the sense transistor may be an NMOS-transistor or a PMOS-transistor, and the well may be a p-well or an n-well, respectively.

According to a second set of embodiments, a p-well and/or an n-well may be formed in the well being connected to the excitation signal providing circuitry. When at least one p-well and at least one n-well are formed in the well, the well may sometimes be referred to as an iso-well.

Furthermore, the well may be common to a plurality of sensing elements. For instance, the well may be an iso-well surrounding n-wells and p-wells of several sensing elements. The excitation signal providing circuitry may be connected to the iso-well and to the well(s) formed inside the iso-well, and configured to change the voltages of the iso-well and the well(s) formed inside the iso-well.

According to various embodiments, each of the sensing elements may comprise timing circuitry connected to the excitation signal providing circuitry for: providing a first excitation control signal to the excitation signal providing circuitry for triggering a first change in the potential difference between finger and sensing structure at a first excitation transition time; and providing a second excitation control signal to the excitation signal providing circuitry for triggering a second change in the potential difference between finger and sensing structure at a second excitation transition time.

According to various embodiments, moreover, each of the sensing elements may further comprise: reset circuitry controllable to discharge the feedback capacitor; and timing circuitry connected to the reset circuitry for controlling the reset circuitry between a reset state in which the feedback capacitor is discharged, and a measurement ready state in which the feedback capacitor can be charged to allow measurement of the change of the charge carried by the sensing structure.

Through the provision of timing circuitry locally in each sensing element or group of sensing elements, at least some of the timing control of circuitry comprised in the sensing element or group of sensing elements may be locally controlled in each sensing element or group of sensing elements.

It can thus be said that the timing circuitry functions as a local state machine, which may be asynchronous or synchronous, or a combination thereof.

By providing localized timing of at least the most time critical transition(s) between measurement states, the time available for measurement can be increased (for a given readout frequency) and/or the design of the capacitive fingerprint sensing device facilitated. For instance, careful routing of certain timing control signals to each sensing element will not be necessary, but the timing can be initiated by an external signal selecting a particular sensing element.

Accordingly, these embodiments of the present invention further facilitate the realization of a higher readout frequency, which in turn allows improved measurement performance and further enables combination of multiple output signals (for example through filtering), whereby common mode noise can be reduced and the signal-to-noise ratio increased.

The timing circuitry may advantageously comprise at least a first delay element for controlling the sensing element to transition from a first measurement state to a second measurement state at a transition time defined by a first event and a time delay in relation to the first event, the first delay element having an input for receiving a first signal defining the first event and an output for providing a second signal defining the transition from the first measurement state to the second measurement state.

The first signal may be a time-varying voltage, and the first event may, for instance, be defined by a rising flank or falling flank of the first signal.

The first signal may be generated internally in the sensing element, or may, according to various embodiments, be provided as a signal, which may, for example, be referred to as an activation signal or selection signal, generated outside the sensing element.

The second signal may be seen as a delayed version of the first signal, but it should be understood that other transformations than a delay may have been imposed on the first signal to form the second signal. For instance, the first signal may additionally have been amplified and/or attenuated and/or inverted etc to form the second signal.

The first delay element may advantageously comprise semiconductor circuitry, such as one or more logic gates.

The capacitive fingerprint sensing system according to various embodiments of the present invention may advantageously be included in an electronic device, further comprising processing circuitry configured to: acquire the representation of the fingerprint pattern from the fingerprint sensing system; authenticate a user based on the representation; and perform at least one user-requested process only if the user is authenticated based on the representation. The electronic device may, for example, be a handheld communication device, such as a mobile phone or a tablet, a computer, or an electronic wearable item such as a watch or similar.

According to a second aspect of the present invention, there is provided a method of sensing a fingerprint pattern of a finger using a capacitive fingerprint sensing system comprising excitation signal providing circuitry; and a plurality of sensing elements, each including: a protective dielectric top layer to be touched by the finger; an electrically conductive sensing structure arranged underneath the top layer; and sensing circuitry connected to the sensing structure for providing a sensing signal indicative of a change of a charge carried by the sensing structure resulting from a change in potential difference between the finger and the sensing structure, wherein the method comprises the steps of: providing, using the excitation signal providing circuitry, an excitation signal to at least one of the finger and the sensing structure, to provide a time-varying potential difference between the finger and the sensing structure; providing, by the fingerprint sensing system, a demodulation signal being timing-related to the excitation signal; combining, by the fingerprint sensing system, the demodulation signal and the sensing signal to provide a combined signal including a DC signal component indicating the change of the charge carried by the sensing structure; and providing, using readout circuitry external to the sensing elements, a representation of the fingerprint pattern based on the DC signal component from each of the sensing elements.

Further embodiments of, and effects obtained through this second aspect of the present invention are largely analogous to those described above for the first aspect of the invention.

In summary, the present invention relates to a capacitive fingerprint sensing system comprising excitation signal providing circuitry and a plurality of sensing elements. Each sensing element includes a protective dielectric top layer, an electrically conductive sensing structure coupled to the excitation signal for providing a sensing signal indicative of a change of a charge carried by the sensing structure resulting from a change in potential difference between the finger and the sensing structure, and demodulation circuitry connected to the sensing circuitry for combining the sensing signal and a demodulation signal being timing-related to the excitation signal to provide a combined signal including a DC signal component indicating the change of the charge carried by the sensing structure. The fingerprint sensing system further comprises readout circuitry connected to each of the sensing elements for providing a representation of the fingerprint pattern based on the DC signal component from each of the sensing elements.

BRIEF DESCRIPTION OF THE DRAWINGS

These and other aspects of the present invention will now be described in more detail, with reference to the appended drawings showing an example embodiment of the invention, wherein:

FIG. 4b is a circuit diagram of exemplary demodulation circuitry for use in the fingerprint sensing device in FIG. 4a;

DETAILED DESCRIPTION OF EXAMPLE EMBODIMENTS

In the present detailed description, various embodiments of the fingerprint sensing device and method according to the present invention are mainly described with reference to a capacitive fingerprint sensing system, in which each sensing element comprises excitation signal providing circuitry for providing an excitation or drive signal to the sensing structure. Moreover, the capacitive fingerprint sensing device is illustrated as a touch sensor dimensioned and configured to acquire a fingerprint representation from a stationary finger.

It should be noted that this by no means limits the scope of the present invention, which equally well includes, for example, a capacitive fingerprint sensing system in which the change in potential difference between finger potential and sensing structure potential is instead achieved by controlling the reference potential, such as the local ground level, of the fingerprint sensor component in relation to a reference potential of the electronic system in which the fingerprint sensing system is included. Other sensor array configurations, such as a so-called swipe sensor (or line sensor) for acquiring a fingerprint representation from a moving finger, are also within the scope of the present invention as defined by the appended claims. A touch sensor may also have other dimensions than those illustrated in the appended drawings.

Figure 1:
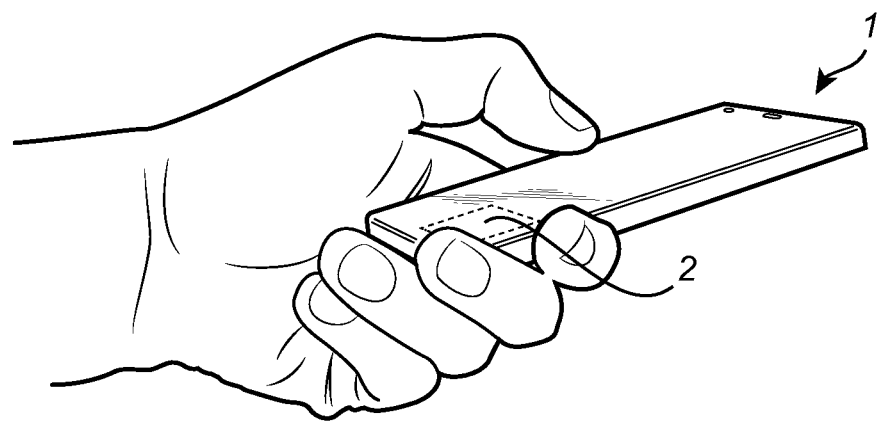
FIG. 1 schematically illustrates a mobile phone comprising a fingerprint sensing system.

FIG. 1 schematically illustrates an application for a fingerprint sensing system according to an example embodiment of the present invention, in the form of a mobile phone 1 with an integrated fingerprint sensing system 2. The fingerprint sensing system 2 may, for example, be used for unlocking the mobile phone 1 and/or for authorizing transactions carried out using the mobile phone, etc.

Figure 2:
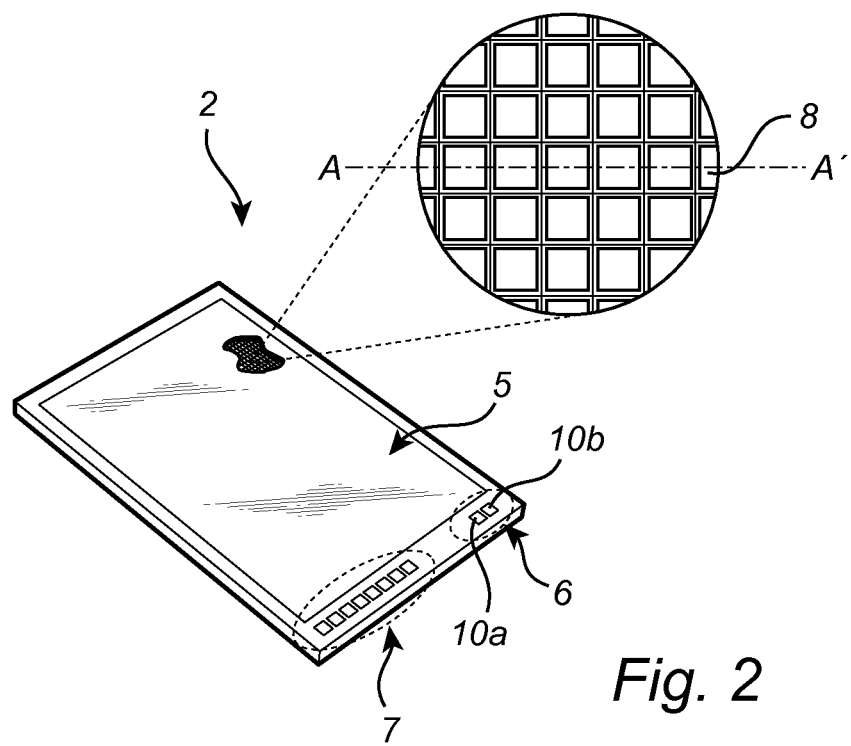
FIG. 2 schematically shows the fingerprint sensing system in FIG. 1.

FIG. 2 schematically shows the fingerprint sensing system 2 comprised in the mobile phone 1 in FIG. 1. As can be seen in FIG. 2, the fingerprint sensing system 2 comprises a sensor array 5, a power supply interface 6 and a communication interface 7. The sensor array 5 comprises a large number of sensing elements 8 (only one of the sensing elements has been indicated with a reference numeral to avoid cluttering the drawing), each being controllable to sense a distance between a sensing structure (top plate) comprised in the sensing element 8 and the surface of a finger contacting the top surface of the sensor array 5.

The power supply interface 6 comprises first 10a and second 10b contact pads, here shown as bond pads, for connection of a supply voltage $V_{supply}$ to the fingerprint sensor 2.

The communication interface 7 comprises a number of bond pads for allowing control of the fingerprint sensor 2 and for acquisition of fingerprint data from the fingerprint sensor 2.

Figure 3:
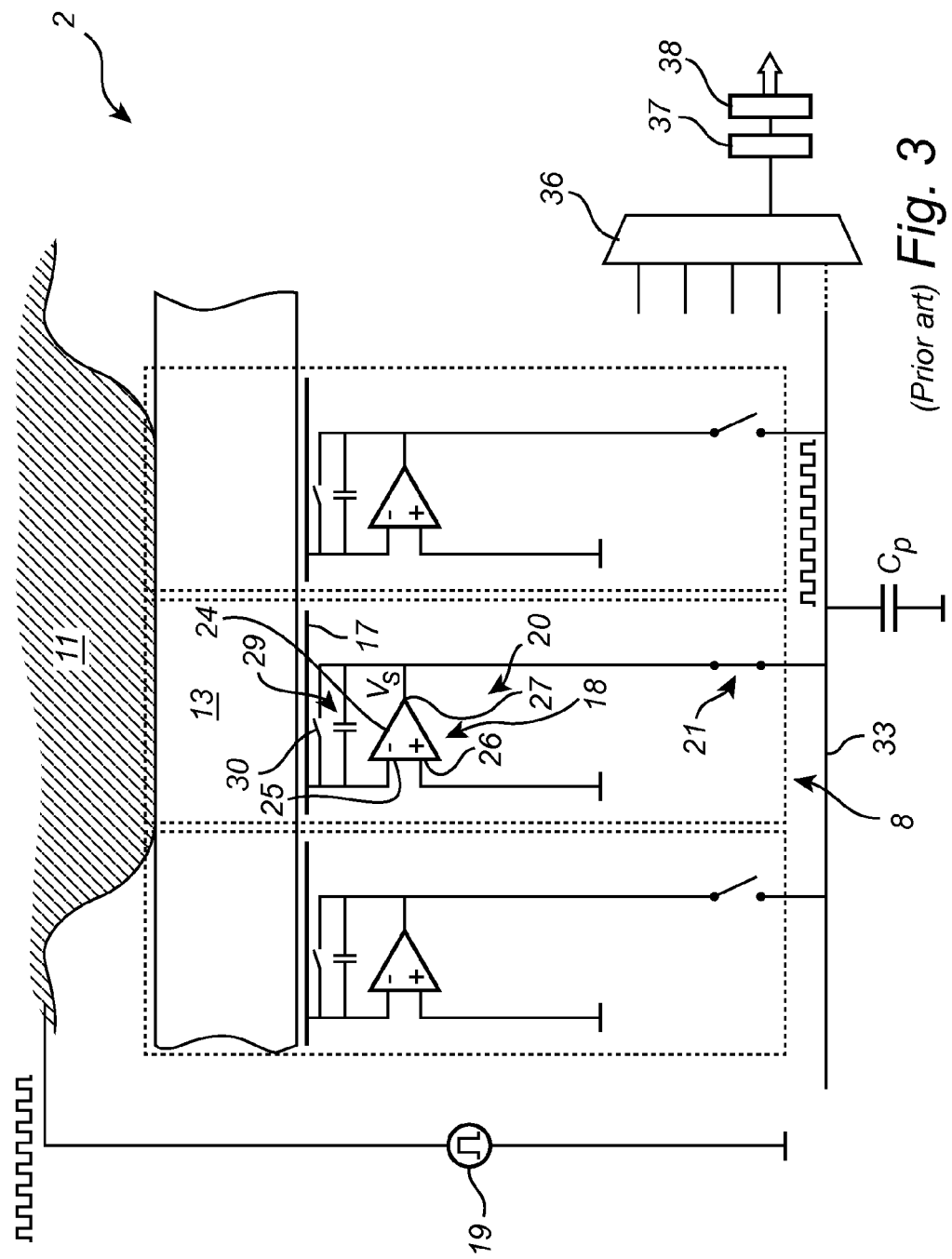
FIG. 3 is a schematic cross-section view of a portion of the fingerprint sensing system in FIG. 2 illustrating an example of a fingerprint sensing device according to the prior art using circuit schematics to illustrate the configuration of the sensing elements and the transmission of sensing signals from the sensing elements to the readout circuitry.

FIG. 3 is a schematic cross section of a portion of a fingerprint sensing system according to the prior art, taken along the line A-A' as indicated in FIG. 2 with a finger 11 placed on top of the sensor array 5. The fingerprint sensing system comprises a plurality of sensing elements 8, each comprising a protective dielectric top layer 13, a conductive sensing structure, here in the form of a metal plate 17 underneath the protective dielectric top layer 13, a charge amplifier 18, selection circuitry, here functionally illustrated as a simple selection switch 21 for allowing selection/activation of the sensing element 8, and excitation signal providing circuitry 19 for providing an excitation signal to the finger as is schematically indicated in FIG. 3.

The charge amplifier 18 comprises at least one amplifier stage, here schematically illustrated as an operational amplifier (op amp) 24 having a first input (negative input) 25 connected to the sensing structure 17, a second input (positive input) 26 connected to the excitation signal providing circuitry 19, and an output 27. In addition, the charge amplifier 18 comprises a feedback capacitor 29 connected between the first input 25 and the output 27, and reset circuitry, here functionally illustrated as a switch 30, for allowing controllable discharge of the feedback capacitor 29. The charge amplifier 18 may be reset by operating the reset circuitry 30 to discharge the feedback capacitor 29.

As is often the case for an op amp 24, the voltage at the first input 25 follows the voltage applied to the second input 26. Depending on the particular amplifier configuration, the potential at the first input 25 may be substantially the same as the potential at the second input 26, or there may be a substantially fixed offset between the potential at the first input 25 and the potential at the second input 26.

The provision of the time-varying potential to the finger 11 results in a time-varying potential difference between the sensing structure 17 and the finger 11.

As will be described in more detail further below, the above-described change in potential difference between the finger 11 and the reference structure 17 results in a sensing signal $V_s$ on the output 27 of the charge amplifier 18.

When the indicated sensing element 8 is selected for sensing, the selection switch 21 is closed to connect the output of the charge amplifier to the readout line 33. The readout line 33, which may be a common readout line for a row or a column of the sensor array 5 in FIG. 2, is shown in FIG. 3 to be connected to readout circuitry 310, e.g., a multiplexer 36. As is schematically indicated in FIG. 3, additional readout lines providing sensing signals from other rows/columns of the sensor array 5 are also connected to the multiplexer 36.

The sensing signals $V_s$ from the sensing elements 8 are demodulated by sample-and-hold circuitry 37 arranged outside the array of sensing elements. The output of the sample-and-hold circuitry 37 is connected to an analog-to-digital converter 38 for converting the analog DC voltage signals output by the sample-and-hold circuitry to a digital representation of the fingerprint pattern of the finger 11.

As is schematically indicated in FIG. 3, there is a parasitic capacitance $C_p$ between the readout line 33 and ground. When transmitting the sensing signal $V_s$ along the readout line 33, a certain current is required for driving the readout line 33 up and down in potential against the parasitic capacitance $C_p$. This current is frequency dependent. With the readout frequency used in known capacitive fingerprint sensing devices, such as in the order of 1 MHz, the power consumption due to the parasitic capacitance of the readout line can be seen as acceptable given that the sensing device is well-designed so that the parasitic capacitance is in the order of, say, 1 pF. If, however, the readout frequency would be considerably increased, to, say, 20 MHz or more, the power consumption due to the parasitic capacitance $C_p$ would become substantial.

Various embodiments of the present invention allow for an increase in readout frequency without the above-described increase in current consumption due to the parasitic capacitance of the readout lines 33.

A first embodiment of a fingerprint sensing system according to the present invention will now be described with reference to FIGS. 4a-b.

Figure 4A:
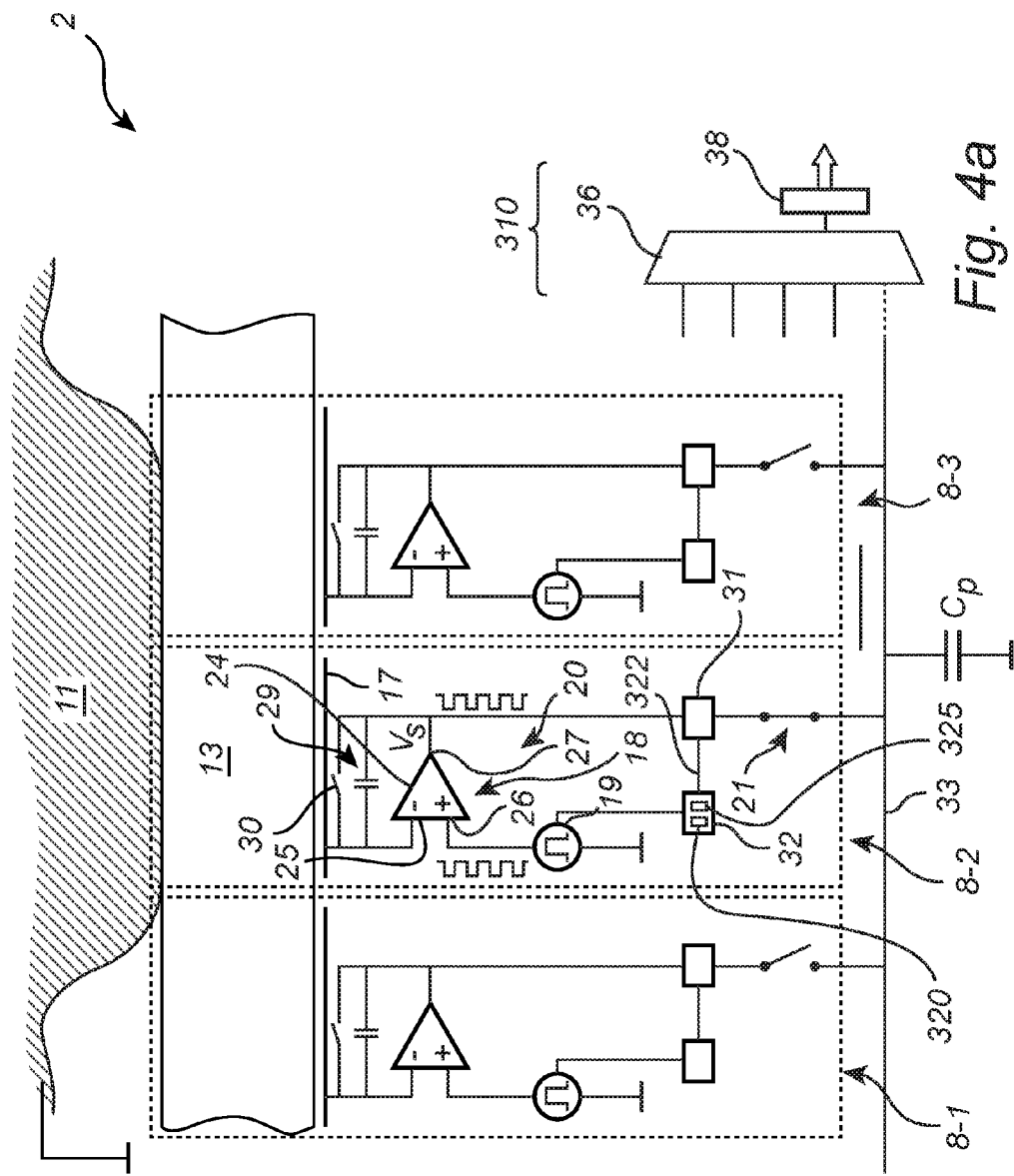
FIG. 4a is a schematic cross-section view of a portion of the fingerprint sensing system in FIG. 2 illustrating a first embodiment of the fingerprint sensing system according to the present invention.

The fingerprint sensing system in FIG. 4a mainly differs from that described above with reference to FIG. 3 in that the excitation signal providing circuitry 19 is coupled to the sensing structure 17, and in that each sensing element (sensing elements 8-1, 8-2, and 8-3, referred to herein collectively and individually as "sensing element(s) 8") further comprises demodulation circuitry, here in the form of demodulator 31, and demodulation signal providing circuitry 32. According to some embodiments, the demodulation circuitry may comprise signal multiplication circuitry 320 for multiplying the sensing signal with the demodulation signal. The demodulation circuitry may further comprise a low-pass filter 325 for allowing the DC signal component to pass while removing higher frequency components.

The finger 11 is schematically indicated as being "grounded" in FIG. 4a. It should be understood that the finger "ground" may be different from the sensor ground. For instance, the finger may be at the ground potential of the electronic device in which the capacitive fingerprint sensing system is included. Alternatively, the body may be considered to have such a large electrical "mass" that the potential of the finger remains substantially constant when the potential of the reference structure 17 varies.

The demodulation signal providing circuitry 32 is connected to the excitation signal providing circuitry 19 for providing a demodulation signal 322 based on the excitation signal output by the excitation signal providing circuitry. The demodulation signal 322 is timing-related to the excitation signal, and is thus also timing-related to the sensing signal Vs output by the charge amplifier 18.

The demodulator 31 is connected to the output 27 of the charge amplifier 18 and to the demodulation signal providing circuitry 32 for combining the sensing signal with the demodulation signal 322 to provide a combined signal including a DC signal component indicating the above-mentioned change of charge carried by the sensing structure 17, resulting from repeated changes in the potential difference between the potential of the finger 11 and the potential of the sensing structure 17.

In some embodiments, there may be no need for any demodulation signal providing circuitry 32, but the excitation signal may be directly provided to the demodulator 31 for combination with the sensing signal Vs. In other embodiments, the demodulation signal providing circuitry 32 may generate one or several demodulation signal(s) 322 having a timing relation to the excitation signal. An example of demodulation signal providing circuitry 32 in the form of timing circuitry generating sampling control signals for a demodulator in the form of a double sampler will be described further below with reference to FIGS. 5a-b, FIG. 6, FIG. 7 and FIG. 8.

Depending on the configuration of the sensing element 8 and the wave-form of the excitation signal, the demodulator 31 may be implemented in various ways known to the skilled person. In principle, any suitable mixer or demodulator developed for AM-demodulation may be adapted for use in the sensing element in fingerprint sensing systems according to the present invention.

Figure 4B:
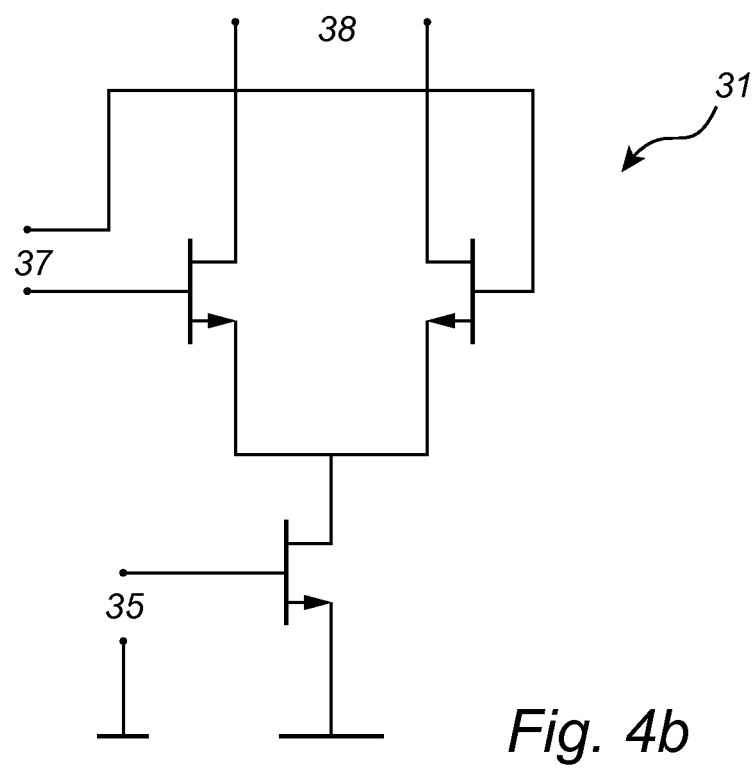

FIG. 4b is a circuit diagram of simple demodulating circuitry (mixer) 31 having a first input 35 for receiving the sensing signal $V_s$, a second input 37 for receiving the excitation signal from the excitation signal providing circuitry 19, and an output 38 for providing a combined signal including a DC signal component indicating the change of charge carried by the sensing structure 17, which in turn indicates the (electrical) distance between sensing structure 17 and finger 11.

Figure 5A:
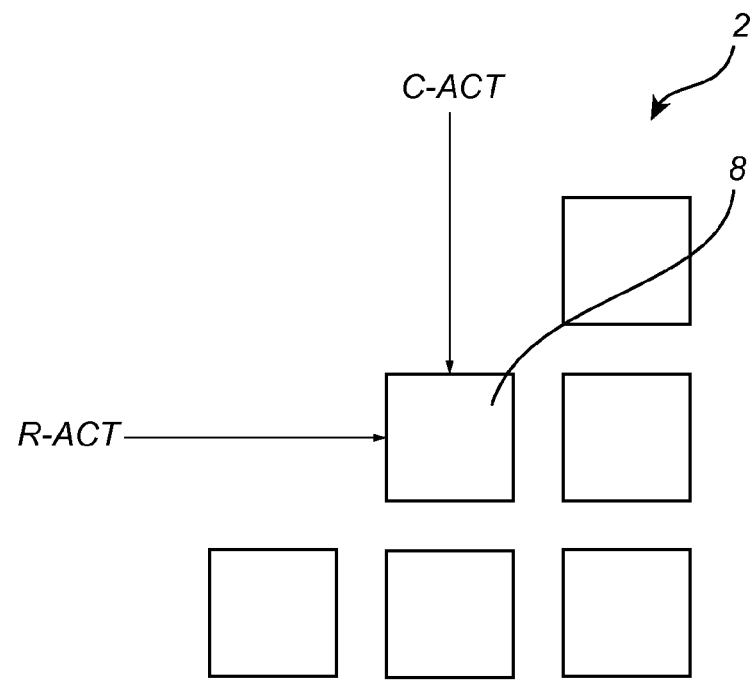
FIGS. 5a-b schematically illustrate a sensing element comprised in a sensing system according to a second embodiment of the present invention.
Figure 5B:
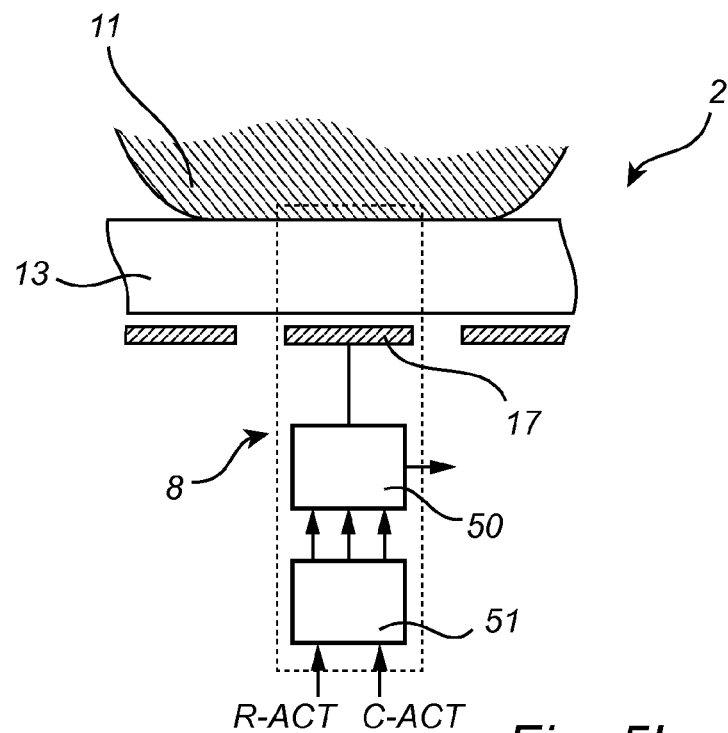

FIGS. 5a-b schematically illustrate a sensing element 8 comprised in a capacitive fingerprint sensing system 2 according to a second embodiment of the present invention.

Referring first to FIG. 5a, a sensing element 8 from the sensor array 5 in FIG. 2 is shown together with its closest neighbors. The sensing element(s) 8 to be sensing the capacitive coupling between its sensing structure 17 and the finger 11 may be selected using activation signals from row selection circuitry and column selection circuitry. Such activation signals are indicated as R-ACT and C-ACT in FIG. 5a.

Referring to FIG. 5b, each sensing element 8 in the capacitive fingerprint sensing system 2 comprises sensing circuitry 50 (such as the charge amplifier 18, excitation signal providing circuitry 19, and demodulator 31 in FIG. 4) and timing circuitry 51.

The sensing circuitry 50 is connected to the sensing structure (plate) 17 for measuring the change of the charge carried by the sensing structure 17 resulting from a change in a potential difference between the finger 11 and the sensing structure 17. This measurement is carried out by performing a measurement sequence comprising transitioning through a sequence of measurement states. An example measurement sequence will be described in detail further below with reference to FIG. 6 and FIG. 7. The sensing circuitry 50 has an output for providing the above-mentioned combined signal provided by the demodulator to the readout line 33.

The timing circuitry 51 is connected to the sensing circuitry 50 for controlling a timing of at least one of the measurement states.

As is schematically illustrated in FIG. 5b, the timing circuitry 51 may receive one or several control signals for triggering a measurement operation of the sensing element 8. For instance, the above-mentioned row and column activation signals R-ACT and C-ACT may be received by the timing circuitry 51, which thereafter may independently provide to the sensing circuitry 50 various timing control signals as is schematically indicated by the arrows in FIG. 5b.

Through this local control of the timing of at least one of the measurement states comprised in the measurement sequence, the timing of transitions between measurement states can be more precisely and/or uniformly controlled, which allows for shorter times between transitions, which in turn allows for a higher measurement frequency.

Figure 6:
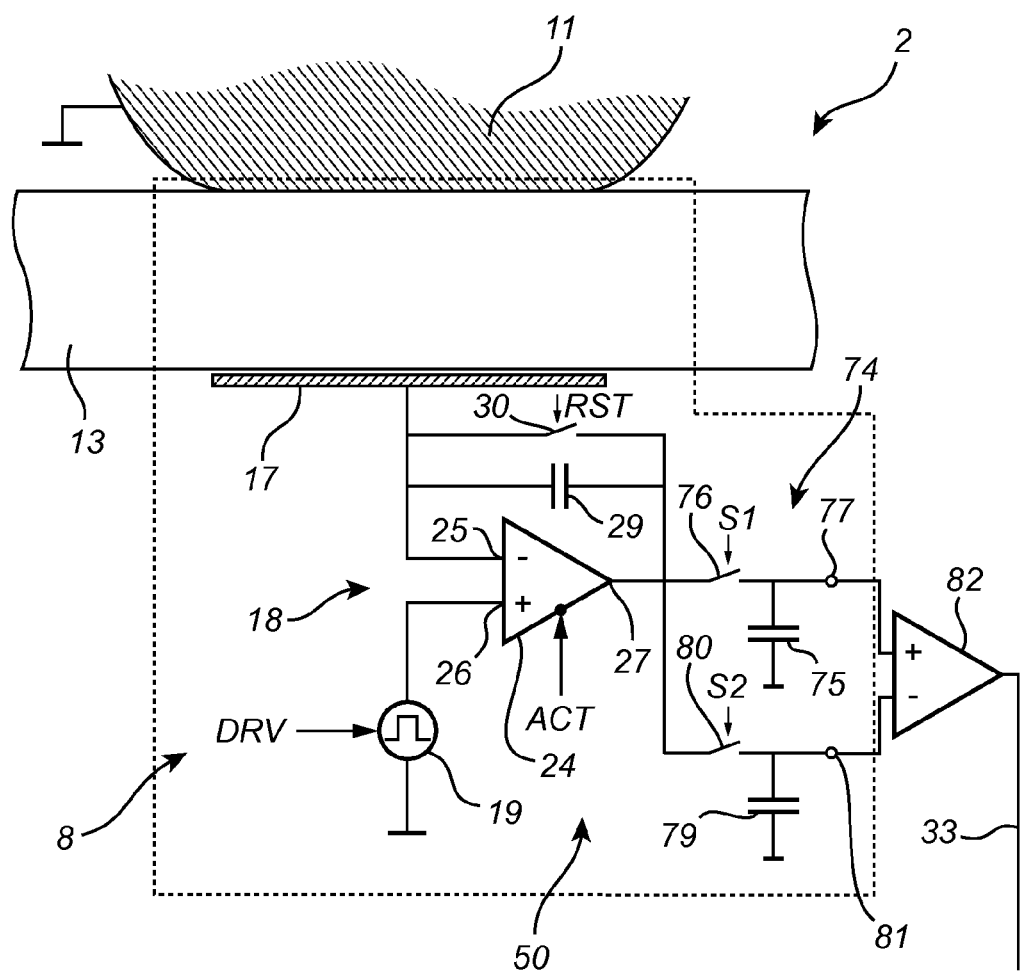
FIG. 6 is a schematic circuit diagram of a part of the sensing element in FIG. 5b, including the sensing circuitry and the demodulation circuitry.

An example of the sensing circuitry 50 in FIG. 5b is shown in greater detail in FIG. 6. Control signals provided by the timing circuitry 51 (the activation signal ACT, the reset signal RST, the drive control signal DRV, and first S1 and second S2 sampling control signals) are indicated by arrows in FIG. 6.

The sensing circuitry 50 in FIG. 6 comprises a charge amplifier 18, excitation signal providing circuitry here represented by a controllable voltage source 19, and a demodulator in the form of sample-and-hold circuitry 74.

As described above for the sensing element 8 in FIG. 3, the charge amplifier in the sensing circuitry 50 of FIG. 6 comprises a negative input 25, a positive input 26, an output 27, a feedback capacitor 29, and an amplifier 24.

The negative input 25 is connected to the sensing structure (plate) 17 and the output 27 is connected to sample-and-hold circuitry 74 comprised in the sensing element 8.

The feedback capacitor 29 is connected between the negative input 25 and the output 27 and defines the amplification of the charge amplifier 18, and the sensing element 8 further comprises a reset switch 30 in parallel with the feedback capacitor 29.

Rather than being directly connected to ground or to another reference potential, the positive input 26 is connected to the controllable voltage source 19.

The sample-and-hold circuitry 74 comprises a first sampling capacitor 75, a first sampling switch 76 and a first output 77, and a second sampling capacitor 79, a second sampling switch 80 and a second output 81.

A difference amplifier 82 has a positive input connected to the first output 77 and a negative input connected to the second output 81 of the sample-and-hold circuitry 74. The output of the difference amplifier 82 is connected to readout line 33.

Figure 7:
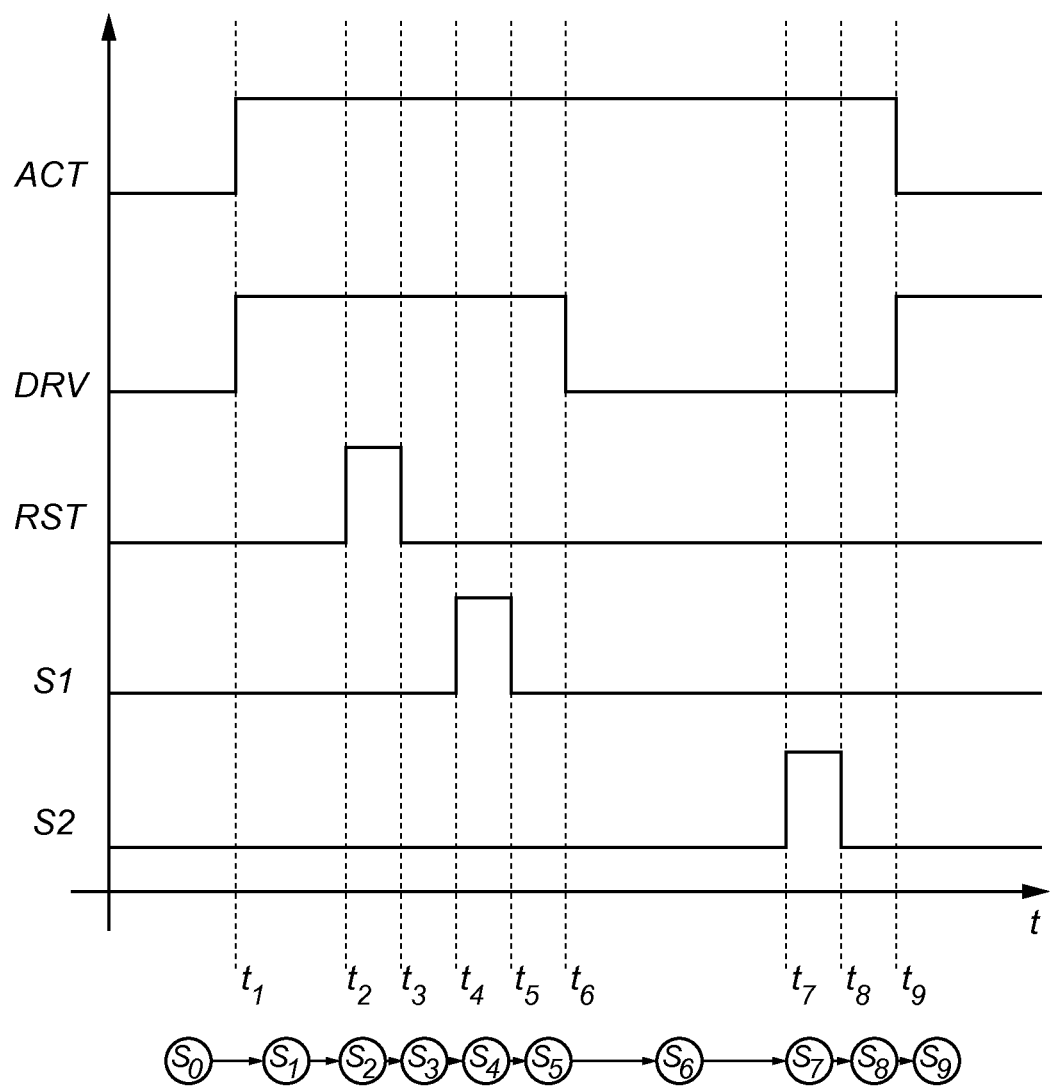
FIG. 7 is a timing diagram illustrating an exemplary measurement sequence for the capacitive fingerprint sensing system in FIG. 6.

FIG. 7 illustrates an exemplary measurement sequence for the sensing element 8 in FIG. 6. By controlling transitions between measurement states in the measurement sequence locally, in the sensing element 8, the measurement sequence illustrated in FIG. 7, or another suitable measurement sequence, can be performed considerably faster, enabling faster readout and/or multiple readings from each sensing elements resulting in improved measurement performance.

Referring to FIG. 7, the timing diagram shown therein comprises, from top to bottom, an activation signal ACT, a drive (excitation) control signal DRV, a reset signal RST, a first sampling control signal S1, and a second sampling control signal S2.

Below the timing diagram, the sequence of measurement states $S_0$-$S_9$ together forming the above-mentioned measurement sequence is schematically indicated.

For activation of the sensing element 8 in FIG. 6, a row-selection signal and a column selection signal indicating the sensing element 8 may typically be provided. In the simplified and schematic timing diagram in FIG. 7 as well as in FIG. 6, such selection signals are represented by a single activation signal ACT.

At a first time $t_1$, the sensing element 8 is activated by a transition of the activation signal ACT from low to high. This may, for example, involve activating the amplifier 24. At substantially the same point in time $t_1$, the drive (excitation) control signal DRV provided by the timing circuitry 51 to the excitation signal providing circuitry 19 is controlled to go from low to high.

At the time $t_1$, there is thus a transition from the "inactive" state $S_0$ to the first measurement state $S_1$ of the measurement sequence.

Application of the excitation signal to the sensing structure 17 will result in a change in the charge carried by the sensing structure 17. After some time to allow the output of the charge amplifier to stabilize, a reset signal RST is provided at the time $t_2$ to close the reset switch 30 to thereby discharge the feedback capacitor and reference the potential at the output 27 of the charge amplifier 18 to the potential of the sensing structure (plate) 17.

Through the provision of the first flank of the reset signal, there is a transition from the first measurement state $S_1$ to the second measurement state $S_2$ (reset state).

The reset switch 30 is released (allowed to open again) at the time $t_3$, to thereby transition to the third measurement state $S_3$ (measurement ready state).

At the time $t_4$, there is a transition to the fourth measurement state $S_4$, in which the first sampling control signal $S_1$ goes from low to high to control the sample-and-hold circuit 74 to sample the sensing signal at the output 27 of the charge amplifier 18.

At the time $t_5$, there is a transition to the fifth measurement state $S_5$, in which the first sampling control signal S1 goes from high to low.

Subsequently, at the time $t_6$, the drive signal DRV goes from high to low to change the potential difference between the finger 11 and the sensing structure 17. This is also the transition to the sixth measurement state $S_6$ as is schematically indicated in FIG. 7.

At the time $t_7$, there is a transition to the seventh measurement state $S_7$, in which the second sampling control signal S2 goes from low to high to control the sample-and-hold circuit 74 to sample the sensing signal at the output 27 of the charge amplifier 18 a second time.

At the time $t_8$, there is a transition to the eighth measurement state $S_8$, in which the second sampling control signal S2 goes from high to low.

Finally, at the time $t_9$, there is a transition to the ninth measurement state $S_9$, where the sensing element 8 is deactivated and the drive signal DRV again goes from low to high. The ninth measurement state $S_9$ is identical to the initial "inactive" state $S_0$.

As is schematically indicated by arrows in FIG. 6, the sensing circuitry 50 can be controlled to perform the measurement sequence described above with reference to FIG. 7 using the above-mentioned control signals (the activation signal ACT, the reset signal RST, the drive control signal DRV, the first sampling control signal S1 and the second sampling control signal S2). When the measurement sequence described with reference to FIG. 4 has been performed, the potential difference between the first 77 and second 81 outputs of the sample-and-hold circuit 74 will be indicative of the capacitive coupling between the sensing structure 17 and the finger 11. This potential difference is provided to the output line 33 via difference amplifier 82.

In the exemplary embodiment described above, the demodulation circuitry is formed by the sample-and-hold circuit 74, and the DC signal component indicating the change in charge is provided by combining the sensing signal at the output 27 of the charge amplifier 18 with the sampling control signals S1 and S2. The sampling control signals are timing-related to the excitation signal, and are generated by demodulation signal providing circuitry in the form of the timing circuit 51.

It should be noted that the circuit diagram in FIG. 6 has been simplified to facilitate description of embodiments of the present invention. For instance, level shifting at the output of the sensing element 8 has been omitted. Implementation of level shifting is, however, straight-forward to one of ordinary skill in the art. Furthermore, a simple example of a level shifter will be described further below with reference to FIG. 10a.

Figure 8:
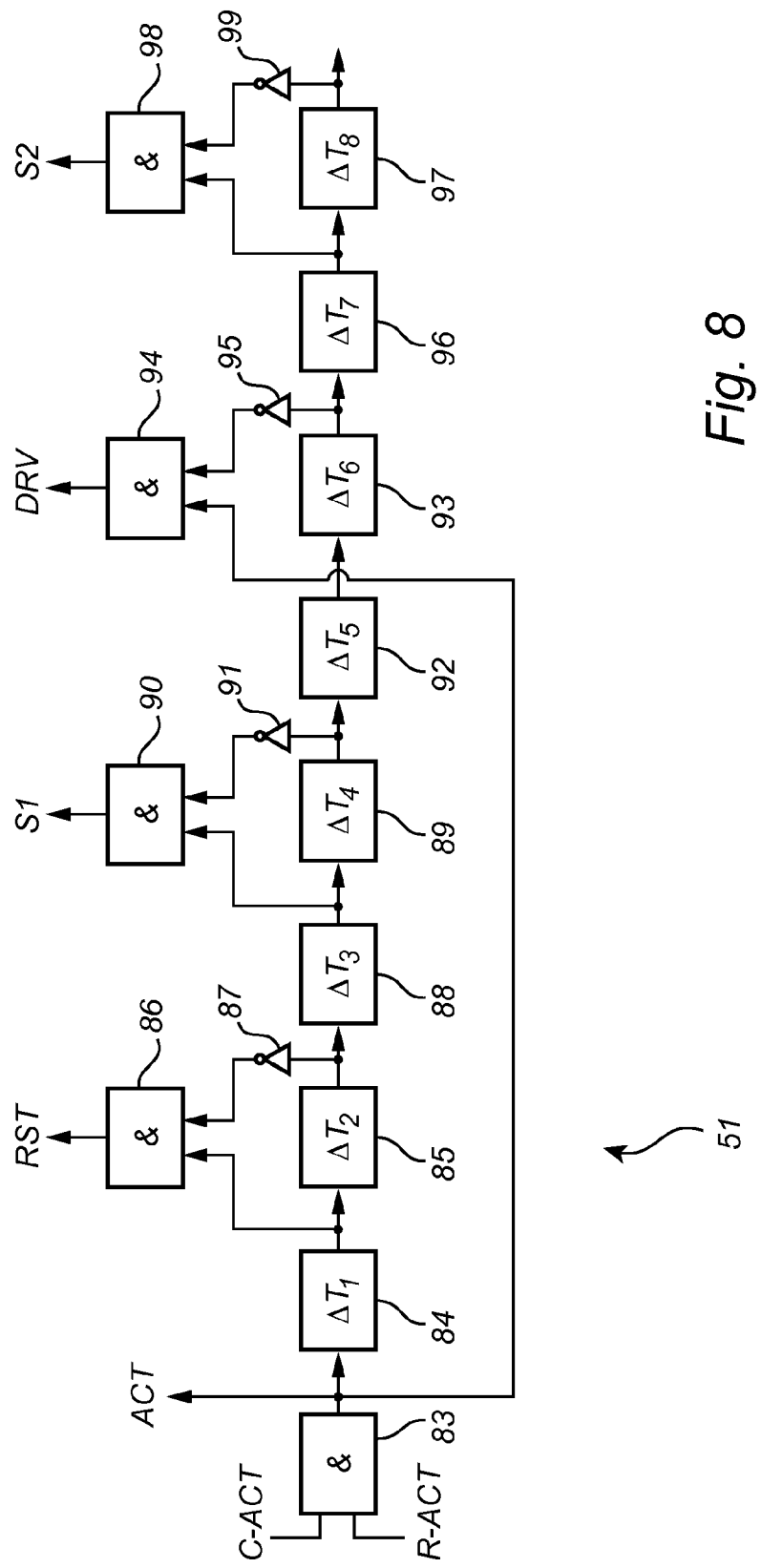
FIG. 8 schematically illustrates exemplary timing circuitry for controlling the timing of the measurement sequence performed by the sensing element in FIG. 6.

With reference to FIG. 8, an exemplary configuration of the timing circuit 51 in FIG. 5b will now be described. As can be seen in FIG. 6b, the timing circuit 51 comprises a first AND-gate 83, a first delay element 84, a second delay element 85, a second AND-gate 86, a first inverter 87, a third delay element 88, a fourth delay element 89, a third AND-gate 90, a second inverter 91, a fifth delay element 92, a sixth delay element 93, a fourth AND-gate 94, a third inverter 95, a seventh delay element 96, an eighth delay element 97, a fifth AND-gate 98, and a fourth inverter 99.

As is schematically indicated in FIG. 8, the row activation signal R-ACT and the column activation signal C-ACT are input to the first logic AND-gate 83. Referring also to FIG. 6, the output of the first AND-gate 83 is provided to the amplifier 24 of the sensing circuitry 50 as the above-mentioned activation signal ACT, to the input of the first delay element 84, and to the fourth AND-gate 94. The output of the first delay element 84 is provided to the second AND-gate 86, and to the input of the second delay element 85. The output of the second delay element 85 is provided to the second AND-gate 86 via the first inverter 87 and to the input of the third delay element 88. The output of the third delay element 88 is provided to the input of the third AND-gate 90 and to the input of the fourth delay element 89. The output of the fourth delay element 89 is provided to the third AND-gate 90 via the second inverter 91, and to the input of the fifth delay element 92. The output of the fifth delay element 92 is provided to the input of the sixth delay element 93. The output of the sixth delay element 93 is provided to the fourth AND-gate 94 via the third inverter 95, and to the input of the seventh delay element 96. The output of the seventh delay element 96 is provided to the input of the eighth delay element 97 and the input of the fifth AND-gate 98. Finally, the output of the eighth delay element 97 is provided to the input of the fifth AND-gate 98 via the fourth inverter 99.

When the sensing element 8 comprising the sensing circuitry 50 in FIG. 6 and the timing circuit 51 in FIG. 8 is selected by setting both the row activation signal R-ACT and the column activation signal C-ACT high, the activation signal ACT for the sensing element 8 goes high (at the time $t_1$ with reference to FIG. 7). The output from the first AND-gate 83 passes through the first delay element 84 and is delayed by a first time delay $\Delta T_1$ to provide a first delayed version of the activation signal ACT to the second AND-gate 86.

The first time delay $\Delta T_1$ corresponds to $t_2$-$t_1$ in FIG. 7 and determines the duration of the first measurement state $S_1$.

The output from the first delay element 84 is also provided to the input of the second delay element 85, and is delayed to provide a second delayed version of the activation signal ACT.

The second delayed version of the activation signal ACT is provided to the input of the second AND-gate 86 via the first inverter 87 to achieve the reset control signal RST on the output of the second AND-gate 86.

The second time delay $\Delta T_2$ corresponds to $t_3$-$t_2$ in FIG. 7 and determines the duration of the second measurement state $S_2$ (where the reset control signal RST is high).

The remainder of the timing circuit 51 works in the same way, with the delay elements being configured to achieve the control signals shown in the timing diagrams of FIG. 7.

Accordingly, the third time delay $\Delta T_3$ corresponds to $t_4$-$t_3$ in FIG. 7 and determines the duration of the third measurement state $S_3$, the fourth time delay $\Delta T_4$ corresponds to $t_5$-$t_4$ in FIG. 7 and determines the duration of the fourth measurement state $S_4$ etc.

It should be noted that the timing circuit 51 is a simplified example for illustrating the principle of using a combination of delay elements and logic gates for locally controlling the timing of measurement states of the charge measuring circuitry comprised in the sensing element. Depending on the actual implementation, the timing circuitry may comprise additional or other circuitry for, for instance, signal shaping and/or timing. Based on the description provided herein, the skilled person will be able to design a suitable implementation of a timing circuit without undue burden.

It should be understood that fewer or additional timing control signals may be independently provided from the timing circuitry 51 to the sensing circuitry 50 depending on the particular embodiment.

Figure 9:
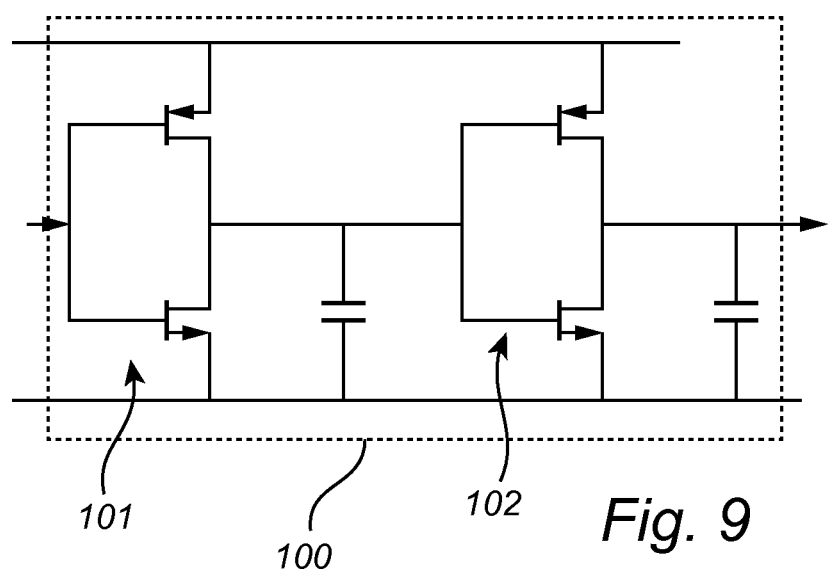
FIG. 9 is a circuit diagram of a delay element comprised in the timing circuitry in FIG. 8.

FIG. 9 shows an illustrative example of a delay element 100 which may be comprised in the timing circuitry 51 in FIG. 8.

The delay element 101 comprises a first CMOS-inverter 101 and a second CMOS-inverter 102 connected in series. The time delay of this delay element will depend on the dimensioning of the components comprised in the delay element 100, and the time delay can thus be set when designing the delay element. If considerably longer delay times are desired, further CMOS-inverters can be coupled in series.

A third embodiment of the fingerprint sensing system 2 in FIG. 2 will now be described with reference to FIGS. 10a-b. The embodiment of FIGS. 10a-b provides for removal or at least a considerable reduction of the influence of parasitic capacitances in the sensing element 8, which in turn further facilitates high frequency operation of the sensing element 8.

Figure 10A:
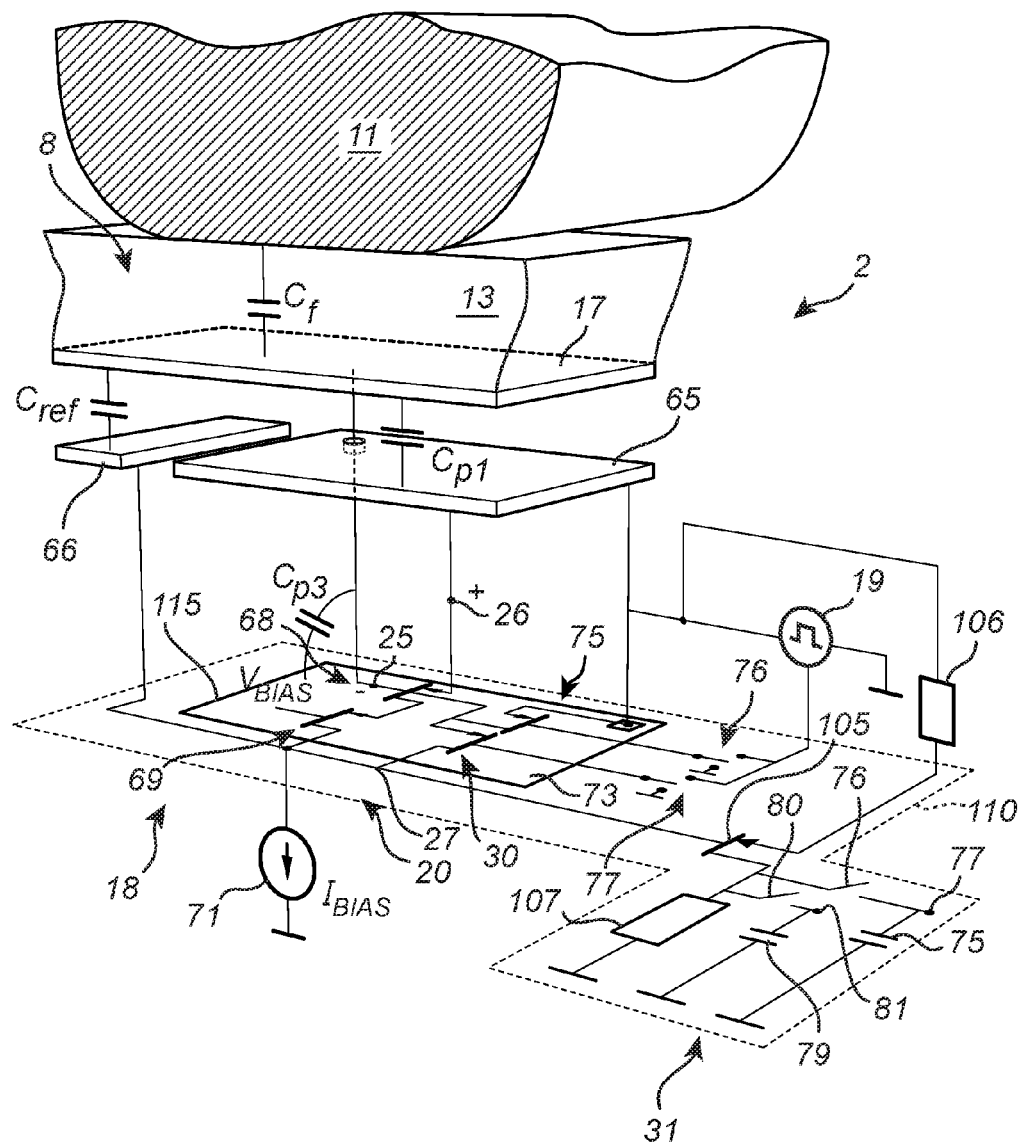
FIGS. 10a-b schematically illustrate a third embodiment of the fingerprint sensing system according to the present invention.

FIG. 10a is a hybrid of a partly structural and partly circuit schematic illustration of an embodiment of the sensing element 8 in FIG. 2 formed on a doped semiconductor substrate 110. The protective dielectric layer 13, the sensing plate 17, a shielding plate 65 and a reference plate 66 are schematically shown in an exploded perspective view, while the charge amplifier 18 is illustrated in the form of a transistor level circuit schematic.

As is shown in FIG. 10a, this example of a simple charge amplifier 18 comprises sense transistor 68, cascode transistor 69, reset circuitry in the form of reset transistor 30 and bias current source 71. The sense transistor 68, the cascode transistor 69 and the reset transistor 30 are all formed in the same well 73 (n-well, p-well or iso-well). As mentioned above, an interface 115 between the well 73 and the substrate 110 can be configured in such a way that current can be prevented from flowing between the well and the substrate.

Figure 10B:
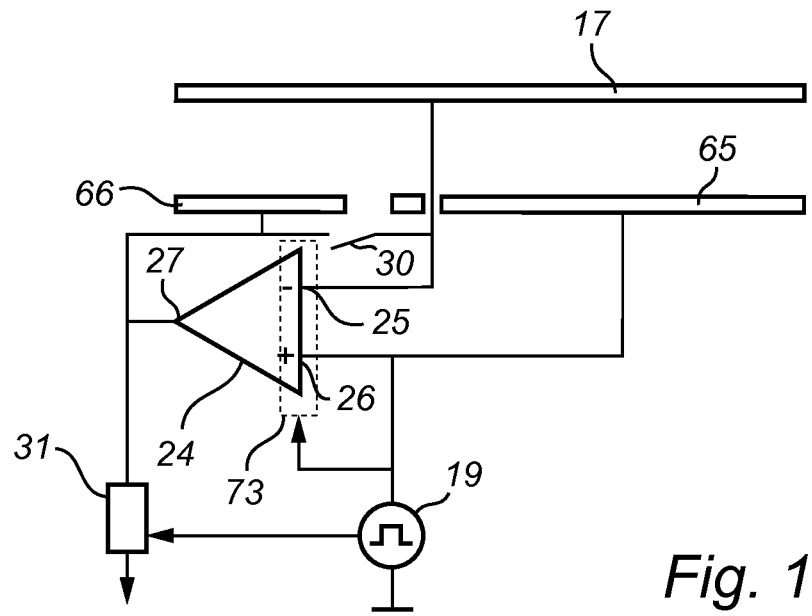

To aid the understanding of the parts and connections in FIG. 10a, the same schematic configuration is also shown in FIG. 10b, on a more abstract level with the transistor circuitry of FIG. 10a replaced by a general symbol for a charge amplifier having its negative input 25 connected to the sensing plate 17, its positive input 26 connected to excitation signal providing circuitry 19, here in the form of a pulse generator, and its output 27 providing a sensing signal $V_s$ indicative of the change in charge carried by the sensing plate 17 resulting from a change in a potential difference between the finger 11 and the sensing plate 17. As was explained above, the change in potential difference between the finger 11 and the sensing plate 17 results from the changing electric potential applied to the sensing plate 17 by the pulse generator 19 via the charge amplifier. A feedback capacitor, formed by the sensing plate 17 and the reference plate 66, is connected between the negative input 25 and the output 27 of the charge amplifier. It should be noted that the general functionality of a charge amplifier is well known to one of ordinary skill in the relevant art. FIG. 10b also schematically indicates that the well 73 is connected to the excitation signal providing circuitry 19.

Returning to FIG. 10a, it can be seen that the gate of the sense transistor 68 constitutes the negative input 25 of the charge amplifier and that the source of the sense transistor 68 constitutes the positive input 26 of the charge amplifier. The positive input 26 of the charge amplifier is connected to the shielding plate 65, which is in turn connected to the well 73 in which the sense transistor 68 is formed, and to the pulse generator 19.

The sensing element 8 further comprises a drive transistor 75, a drive control switch 76 and a reset control switch 77. The drive control switch 76 is controllable between a first state in which the gate of the drive transistor 75 is connected to the pulse generator 19 and a second state in which the gate of the drive transistor 75 is connected to sensor ground. When the drive control switch 76 is in its first state, the drive transistor 75 will be conducting and thus connect the sensing structure 17 directly to the pulse generator 19. When the drive control switch is in its second state, the drive transistor 75 will be non-conducting. In the latter case, there will thus be no direct connection through the drive transistor 75 between the sensing structure 17 and the pulse generator 19. As can be seen in FIG. 10a, the drive transistor 75 is formed in the well 73. The bias current source 71 can be in the sensing element or outside the sensor array 5.

In the same way, the reset control switch 77 is controllable between a first state in which the reset transistor 30 is non-conducting to allow a potential difference between the sensing plate 17 and the feedback plate 66, and a second state in which the reset transistor 30 is conducting to equalize the potentials of the sensing plate 17 and the feedback plate 66.

Referring to FIG. 10a, the sensing element 8 further comprises a simple level shifter and demodulation circuitry 31 in the form of a sampler like the one described above with reference to FIG. 6.

The level shifter comprises a transistor 105, a first resistor 106 and a second resistor 107, and works by first converting the sensing signal at the output 27 of the charge amplifier to a current, and then convert the current back to a voltage, which is now referenced to sensor ground.

Through the configuration of the sensing element 8 in FIG. 10a, the influence of the internal parasitic capacitances $C_{p1}$ and $C_{p3}$ is removed or at least considerably reduced. Furthermore, driving neighboring sensing structures will remove or at least considerably reduce the influence of the parasitic capacitance between neighboring sensing plates.

In the example embodiments of the present invention described above, the excitation signal providing circuitry 19 has been illustrated as being comprised in the fingerprint sensing component. In these and other embodiments, the excitation signal providing circuitry 19 comprised in the fingerprint sensing system may alternatively be provided outside the fingerprint sensor component and be arranged and configured to swing a reference potential of the fingerprint sensor component (sensor ground) between the above-mentioned first and second potentials, in relation to the potential of the finger 11.

Figure 11:
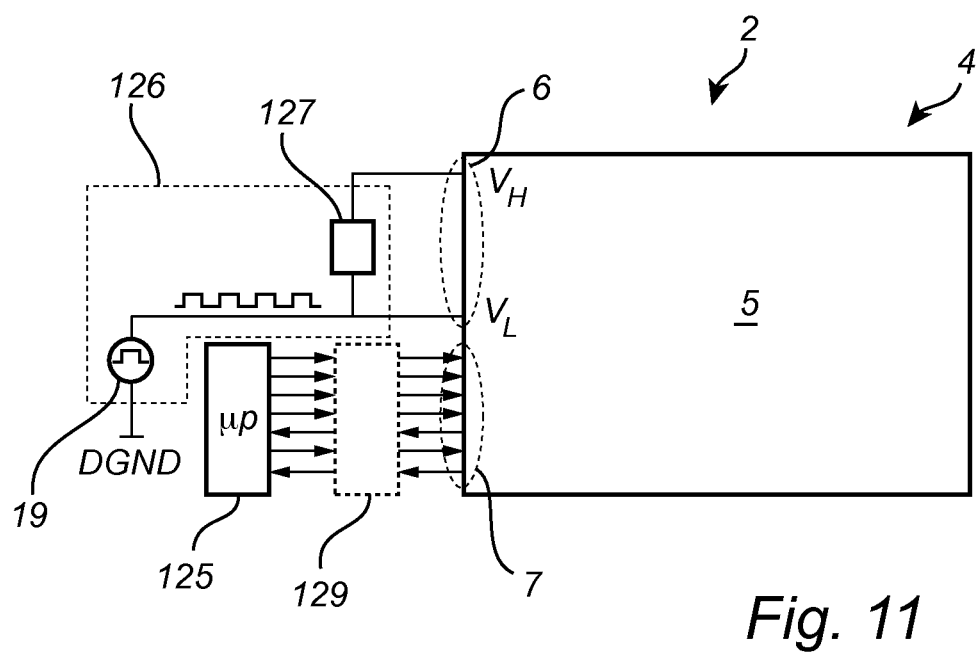
FIG. 11 schematically illustrates embodiments where the excitation signal providing circuitry is arranged and configured to swing a reference potential of the fingerprint sensor component.

This alternative, with the excitation signal providing circuitry 19 outside the fingerprint sensor component, will now be briefly described with reference to FIG. 11. FIG. 11 schematically shows a fingerprint sensing system 2 comprising a fingerprint sensor 4, processing circuitry 125, here in the form of a microprocessor, and power supply circuitry 126.

The fingerprint sensor 4 comprises, as was also described above with reference to FIG. 2, a sensor array 5, a power supply interface 6 and a communication interface 7. The communication interface 7 may, for example, be provided in the form of an SPI-interface (Serial Peripheral Interface).

The microprocessor 125 acquires fingerprint data from the fingerprint sensor 4 and may process the fingerprint data as required by the application. For instance, the microprocessor 125 may run a fingerprint matching (verification and/or identification) algorithm.

The power supply circuitry 126 comprises a sensor voltage source 127 configured to output the supply voltage $V_{supply}$ and excitation signal providing circuitry, here a square wave pulse generator 19, for modulating the low potential side of the sensor voltage source 127 in relation to a reference potential DGND of the electronic device 1 in which the fingerprint sensing system 2 is included.

As an alternative to a square wave signal, the pulse generator may generate any other suitable pulse shape, such as a sine wave or a saw tooth signal etc.

The sensor voltage source 127 may be provided in the form of a constant voltage source, such as a battery, dedicated to supplying power to the fingerprint sensor 4. Alternatively, the sensor voltage source 127 may comprise isolation circuitry for at least partly isolating a voltage source from the fingerprint sensor 4.

As is schematically indicated using a box with dashed line boundaries, the fingerprint sensing system 2 may optionally additionally include isolation circuitry 129 for providing galvanic isolation or level shifting between the sensor array 5 and the microprocessor 125. Through the use of isolation circuitry 129, the microprocessor 125 is allowed to work independently of the varying, in relation to device ground (DGND), reference potential $V_L$ of the sensor array 5.

The isolation circuitry 129 can be implemented in many different ways known to the skilled person. For instance, the isolation circuitry 129 may be implemented using components such as opto-couplers, coils and/or capacitors. Although shown here as separate circuitry, it should be understood that the isolation circuitry 129 may be integrated with the fingerprint sensor 4 or the microprocessor 125.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A capacitive fingerprint sensing system for sensing a fingerprint pattern of a finger, said capacitive fingerprint sensing system comprising:
   excitation signal providing circuitry for providing an excitation signal exhibiting a time-varying excitation potential including recurring changes from a first potential to a second potential and back to the first potential, in relation to a potential of said finger;
   a plurality of sensing elements, each including:
      a protective dielectric top layer to be touched by said finger;
      an electrically conductive sensing structure arranged underneath said top layer, said sensing structure being coupled to said excitation signal providing circuitry to exhibit a time-varying sensing structure potential substantially following said excitation potential, wherein each of said changes of the excitation potential from said first potential to said second potential results in a change in potential difference between said finger and said sensing structure;
      sensing circuitry connected to said sensing structure for providing a sensing signal indicative of a change of a charge carried by said sensing structure resulting from said change in potential difference between said finger and said sensing structure; and
      demodulation circuitry connected to said sensing circuitry for combining said sensing signal and a demodulation signal being timing-related to said excitation signal to provide a combined signal including a DC signal component indicating said change of the charge carried by said sensing structure; and
   readout circuitry connected to each of said sensing elements for providing a representation of said fingerprint pattern based on said DC signal component from each of said sensing elements.

2. The capacitive fingerprint sensing system according to claim 1, wherein said sensing circuitry comprises a charge amplifier comprising:
   a first input connected to said sensing structure;
   a second input connected to said excitation signal providing circuitry;
   an output providing said sensing signal;
   a feedback capacitor connected between said first input and said output; and
   at least one amplifier stage between said first and second inputs, and said output,
   said charge amplifier being configured in such a way that a potential at said first input substantially follows a potential at said second input.

3. The capacitive fingerprint sensing device according to claim 2, wherein said amplifier stage comprised in the charge amplifier comprises a sense transistor having a gate constituting said first input,
   wherein said sense transistor is formed in a well in a semiconductor substrate, an interface between said well and said substrate being configured in such a way that current can be prevented from flowing between said well and said substrate,
   wherein said excitation signal providing circuitry is connected to said well for changing a potential of said well from a third potential to a fourth potential, a difference between said third potential and said fourth potential being substantially equal to a difference between said first potential and said second potential, to thereby reduce an influence of a parasitic capacitance between said sensing structure and said well.

4. The fingerprint sensing device according to claim 3, further comprising a shielding structure arranged between said sensing structure and said substrate,
   wherein said excitation signal providing circuitry is further connected to said shielding plate and configured to change a potential of said shielding plate from a fifth potential to a sixth potential, a difference between said fifth potential and said sixth potential being substantially equal to a difference between said first potential and said second potential.

5. The capacitive fingerprint sensing system according to claim 1, wherein said demodulation circuitry comprises signal multiplication circuitry for multiplying said sensing signal with said demodulation signal.

6. The capacitive fingerprint sensing system according to claim 1, wherein said demodulation circuitry further comprises a low-pass filter for allowing said DC signal component to pass while removing higher frequency components.

7. The capacitive fingerprint sensing system according to claim 1, wherein each of said sensing elements is configured to provide a maximum output current less than 10 µA.

8. The capacitive fingerprint sensing system according to claim 1, wherein said capacitive fingerprint system comprises a fingerprint sensor component comprising said plurality of sensing elements and said readout circuitry.

9. The capacitive fingerprint sensing system according to claim 8, wherein said fingerprint sensor component further comprises said excitation signal providing circuitry.

10. The capacitive fingerprint sensing system according to claim 8, wherein said excitation signal providing circuitry is arranged separate from said fingerprint sensor component and connected to said fingerprint sensor component for providing said excitation signal to a reference potential input of said fingerprint sensor component, to cause a reference potential for said fingerprint sensor component to vary in relation to the potential of said finger.

11. The capacitive fingerprint sensing device according to claim 1, wherein each of said sensing elements comprises timing circuitry connected to said excitation signal providing circuitry for:
   providing a first excitation control signal to said excitation signal providing circuitry for triggering a first change in said potential difference at a first excitation transition time; and providing a second excitation control signal to said excitation signal providing circuitry for triggering a second change in said potential difference at a second excitation transition time.

12. The capacitive fingerprint sensing device according to claim 11, wherein said timing circuitry comprises at least a first delay element for controlling said sensing element to transition from a first measurement state to a second measurement state at a transition time defined by a first event and a time delay in relation to said first event, said first delay element having an input for receiving a first signal defining said first event and an output for providing a second signal defining said transition from the first measurement state to the second measurement state.

13. The capacitive fingerprint sensing device according to claim 1, wherein each of said sensing elements further comprises:

reset circuitry controllable to discharge the feedback capacitor; and timing circuitry connected to said reset circuitry for controlling said reset circuitry between a reset state in which said feedback capacitor is discharged, and a measurement ready state in which said feedback capacitor can be charged to allow measurement of said change of the charge carried by said sensing structure.

14. A method of sensing a fingerprint pattern of a finger using a capacitive fingerprint sensing system comprising excitation signal providing circuitry; and a plurality of sensing elements, each including:

a protective dielectric top layer to be touched by said finger;

an electrically conductive sensing structure arranged underneath said top layer; and sensing circuitry connected to said sensing structure for providing a sensing signal indicative of a change of a charge carried by said sensing structure resulting from a change in potential difference between said finger and said sensing structure, wherein said method comprises the steps of:

providing, using said excitation signal providing circuitry, an excitation signal to at least one of said finger and said sensing structure, to provide a time-varying potential difference between said finger and said sensing structure;

providing, by said fingerprint sensing system, a demodulation signal being timing-related to said excitation signal;

combining, by said fingerprint sensing system, said demodulation signal and said sensing signal to provide a combined signal including a DC signal component indicating said change of the charge carried by said sensing structure; and providing, using readout circuitry external to said sensing elements, a representation of said fingerprint pattern based on said DC signal component from each of said sensing elements.

15. The method of claim 14, further comprising providing said combined signal including said DC signal component, from each of said sensing elements, to said readout circuitry, wherein the representation of said fingerprint pattern is based on said DC signal component included in said combined signal from each of said sensing elements.

* * * * *

UNITED STATES PATENT AND TRADEMARK OFFICE
CERTIFICATE OF CORRECTION

PATENT NO. : 9,460,576 B2  
APPLICATION NO. : 14/812480  
DATED : October 4, 2016  
INVENTOR(S) : Frank Robert Riedijk Page 1 of 1

It is certified that error appears in the above-identified patent and that said Letters Patent is hereby corrected as shown below:

Title Page,

Please insert, --(30)   Foreign Application Priority Data

Dec. 22, 2014   (SE) ..................................... 1451634-8--

Signed and Sealed this
Twentieth Day of December, 2016

Michelle K. Lee
*Director of the United States Patent and Trademark Office*